Figure 1:
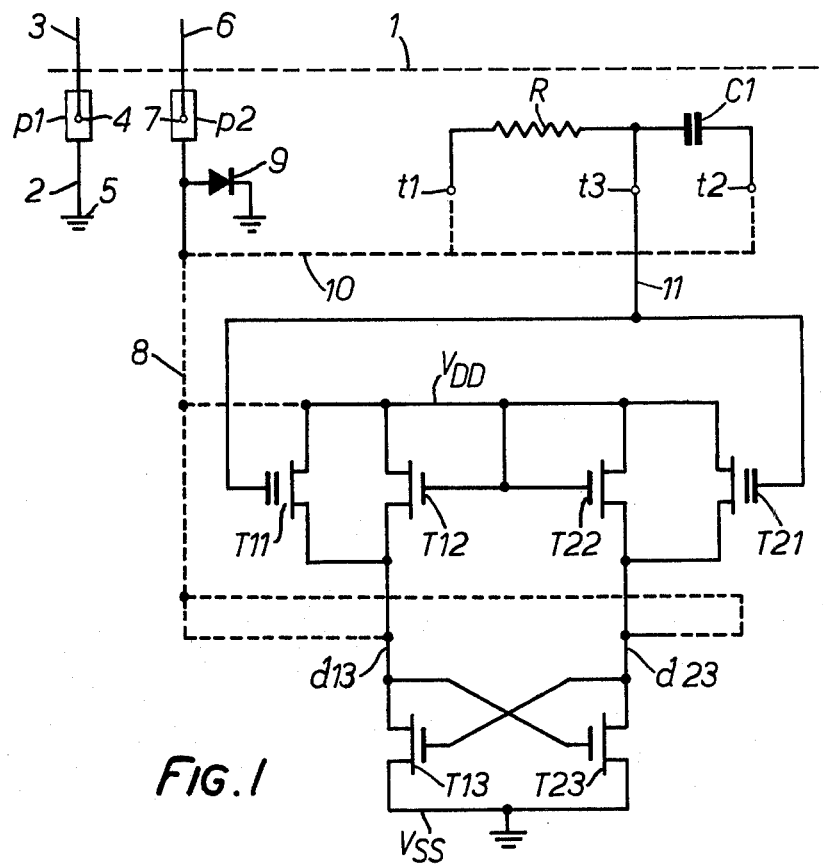

United States Patent [19]
Wilcock et al.

[11] 4,090,259
[45] May 16, 1978

[54] MEANS FOR CONTROLLING THE GATE POTENTIAL OF MNOS TRANSISTORS IN A MEMORY

[75] Inventors: John David Wilcock; John Flackett Dickson, both of Northampton, England

[73] Assignee: Plessey Handel und Investments A.G., Zug, Switzerland

[21] Appl. No.: 688,182

[22] Filed: May 20, 1976

[30] Foreign Application Priority Data

May 20, 1975 United Kingdom ............... 21367/75

[51] Int. Cl.² .......................... G11C 7/00; G11C 11/40
[52] U.S. Cl. ..................................... 365/191; 307/238; 365/184; 365/228
[58] Field of Search .................... 340/173 R; 307/304, 307/238

[56] References Cited

U.S. PATENT DOCUMENTS 3,676,717  7/1972  Lockwood .......................... 307/304

Primary Examiner—Stuart N. Hecker
Attorney, Agent, or Firm—Fleit & Jacobson

[57] ABSTRACT

An information store comprising (a) a known latching circuit which comprises cross connected metal-oxide-silicon transistors and metal-nitride-oxide-silicon transistors and which is accommodated on an integrated circuit chip to which only earth and negative power is supplied, and (b) control means, positive potential for erasing being developed by applying earth and negative potentials selectively to input terminals of the control means, the control means comprising a resistor in series with a capacitor, and an output terminal at the junction of the resistor and capacitor.

9 Claims, 8 Drawing Figures

MEANS FOR CONTROLLING THE GATE POTENTIAL OF MNOS TRANSISTORS IN A MEMORY

This invention relates to electrical information storage devices. These devices may replace mechanical memories and they may be used, for example, in computer memories, television tuners and taxi meters.

Electrical information storage devices are known which make use of metal-oxide-silicon (MOS) transistors accommodated on an integrated circuit chip. The source and drain of such a transistor are separate diffusions in the chip substrate. For p-channel MOS integrated circuits, it is a widespread practice to apply a reference potential to the chip substrate, and to arrange for the potential at any other point in the chip circuitry to be negative in relation to the potential of the substrate. External connections with the chip circuitry is established by means of conductive pads, and it is common practice to provide a protection diode between each pad and the chip substrate. Such a diode protects the circuitry from overload, by becoming conductive if the potential at the relevant pad exceeds the maximum of a working range of negative potentials, or if the potential at the pad becomes positive in relation to the potential at the substrate. A disadvantage of this circuitry is that stored information is lost in the event of a failure of power supplied to the chip. To overcome this difficulty it is known to include metal-nitride-oxide-silicon (MNOS) transistors in the chip. An MNOS transistor is capable of storing an electric charge in the absence of a power supply. On the restoration of the power supply, the stored charges are used to set registers and other logic circuits to a desired state.

A latching circuit is known which comprises a pair of cross-connected MOS transistors and an MNOS transistor corresponding to each MOS transistor. The presence or absence of an information bit is indicated by which of the MOS transistors is conducting. The information may be converted into a charge in the appropriate MNOS transistor by applying a write pulse to the gates of the MNOS transistors. On the restoration of power after an interruption, the MOS transistors are set to the desired condition by applying a read pulse to the gates of the MNOS transistors. A charge stored in an MNOS transistor may be removed by applying an erase pulse to the gates of the MNOS transistors. To provide the three facilities of reading, writing and erasing, it is necessary to apply positive as well as negative potentials to the gates of the MNOS transistors. The requirement of supplying positive potential to the chip is in conflict with the requirement that the protection diodes should conduct in response to positive potential.

According to the invention there is provided an electrical information storage device which comprises: (a) an integrated circuit chip which has a substrate; which accommodates electrical circuitry comprising transistors selected from the group consisting of (i) metal-nitride-oxide-silicon (MNOS) transistors or (ii) metal-oxide-silicon (MOS) transistors and metal-nitride-oxide-silicon (MNOS) transistors; which has a reference connection to the substrate, whereby a reference potential may be applied to the substrate; which has conductive pads by which potentials of one polarity relative to the reference potential may be applied to the circuits, and which has a protection device in respect of each pad, each protection device being connected between the relevant pad and the substrate, and becoming conductive if the relevant pad assumes a potential having a polarity opposite to said one polarity; and (b) control means for controlling the potential at the gate electrodes of the MNOS transistors at a potential having either said one or said opposite polarity, the control means comprising: a first and a second input node at which the reference potential and a potential of said one polarity are selectively applicable; a resistor connected in series with a capacitor between the input nodes; and an output node, located at the junction of the resistor and the capacitor, at which output potentials having said one or said opposite polarity are delivered in dependence on the potentials applied to the input nodes, the output node being connected to the gate electrodes of the MNOS transistors, and being insulated both from the substrate.

The reference connection to the substrate may be made by way of a conductive pad connected direct to the substrate.

Various protection devices may be utilised in the storage device of the present invention. Preferably, the protection device is a diode.

The electrical circuitry of the integrated chip may have first and second input nodes, an output node, means for impressing the state of the input nodes on to the transistors, and an output node which indicates whether the state of the input nodes and the state of the transistors are the same or different.

The electrical circuitry of the integrated chip may also have variable threshold transistors each having a channel region which has an area which is increased so as to give an enhanced capacitance between the gate and the channel of each transistor. The increase in area of the channel region may be regarded as an increase beyond that area necessary for direct current operating conditions.

If the resistor is provided as part of the chip, its connections and requirements for insulation can be met by a suitable design of the chip's structure. However, the value of the resistor may be too high for the resistor to be conveniently provided in this way, or the available surface area of the chip may be inadequate for the purpose. In such circumstances the device may take a hybrid form comprising a discrete resistor in combination with the chip. Specific provision must be made to insulate the output node of the control means from sources of potential external to the chip.

Figure 5:
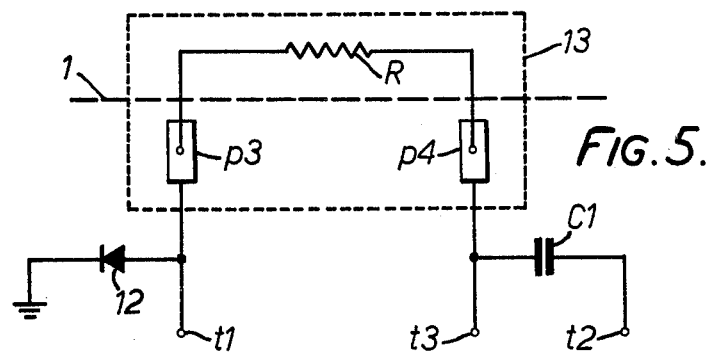
Figure 2:
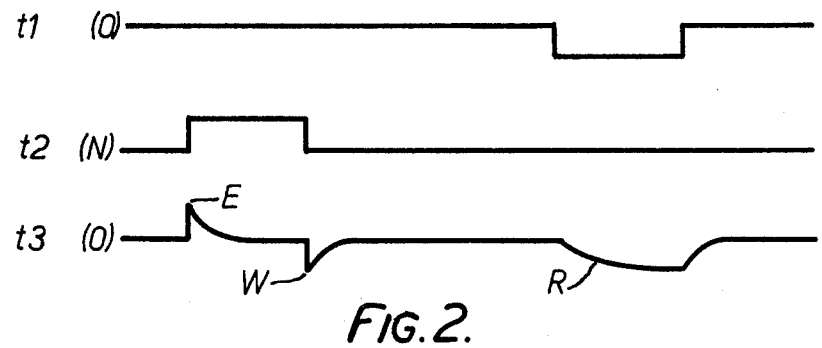
Figure 3:
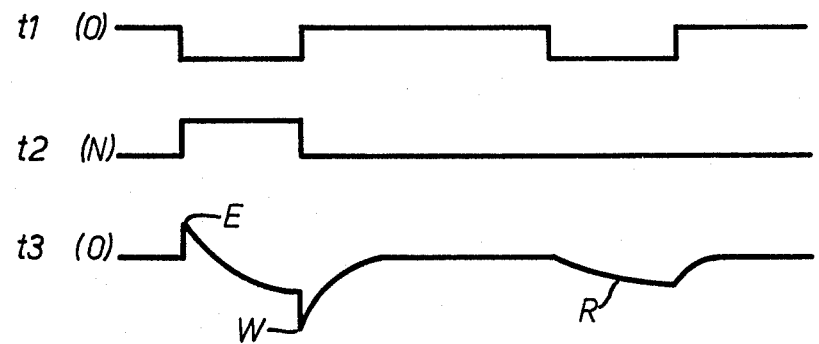
Figure 4:
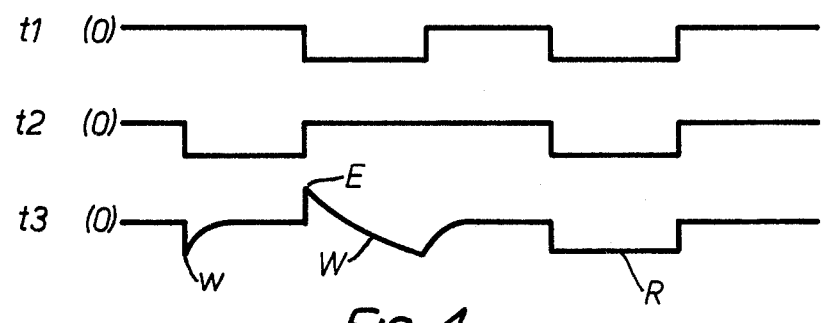
Figure 6:
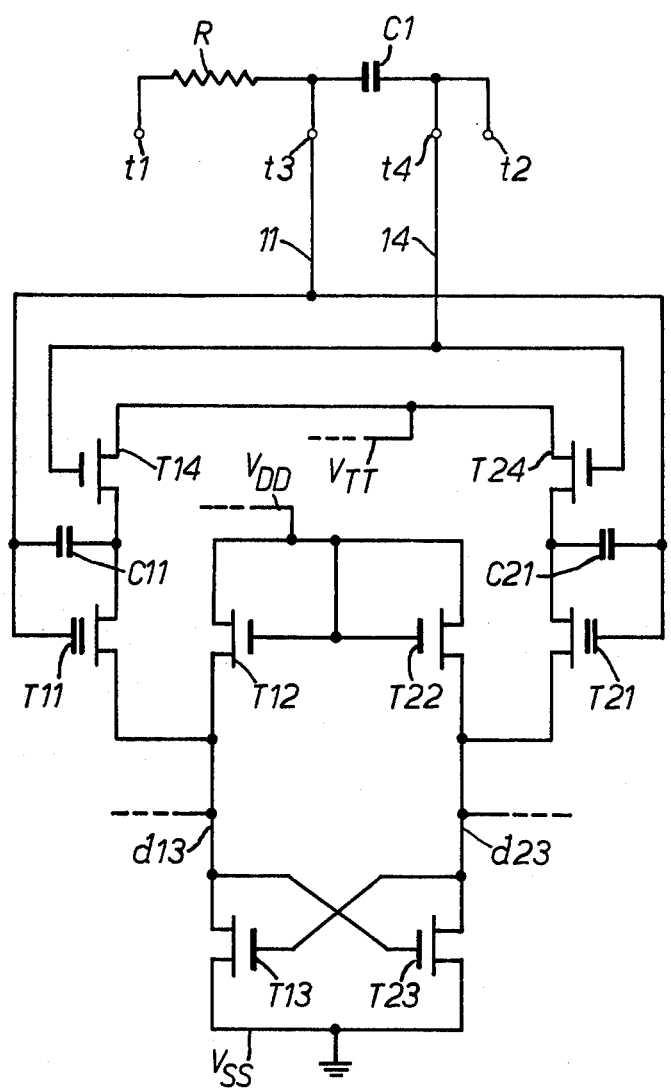
Figure 7:
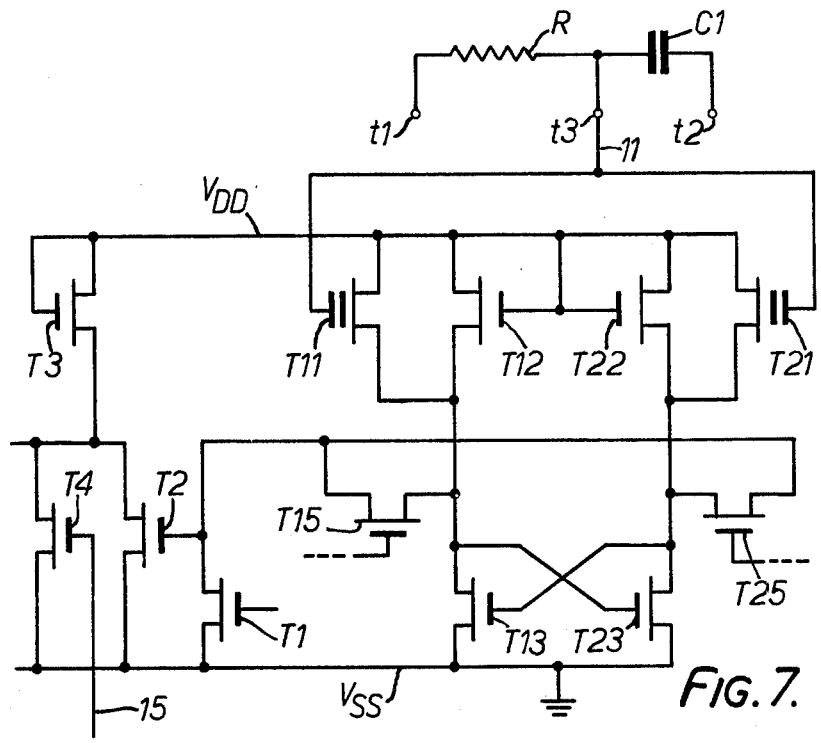
Figure 8:
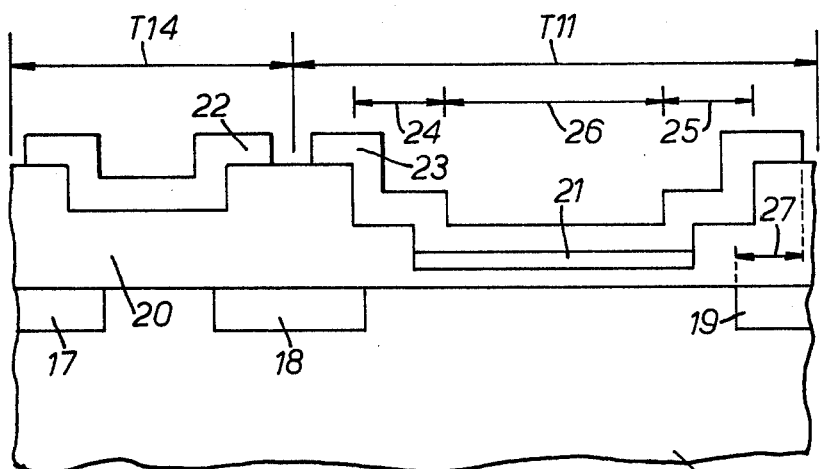

The invention will now be described solely by way of example and with reference to the accompanying drawings in which:

FIG. 1 is a diagram showing a storage device according to the invention which employs a known latching circuit, FIGS. 2, 3, 4 are waveform charts illustrating three different methods of operating the device of FIG. 1, FIG. 5 is a diagram showing, in part, a hybrid form of a device according to the invention, FIG. 6 shows modifications to the device of FIG. 1, FIG. 7 shows further possible modifications to the device of FIG. 1, FIG. 8 is a cross-section of an integrated circuit chip, which is useful in realising the modifications shown in FIG. 6.

All the figures are diagrams and none is drawn to scale.

An edge of an integrated circuit chip is representated in FIG. 1 by the dashed line 1. Conductive pads are ranged along this edge, and are used to establish connection between circuits accommodated in the chip and points external to the chip. One, $p1$, of these pads is connected to the substrate of the chip as shown at 2.

The potential at which the substrate stands serves as a reference potential for the chip. This potential is delivered from outside the chip over a lead 3, which is connected to the pad $p1$ as shown at 4. For convenience, earth potential is taken as the reference potential, as shown at 5.

The chip accommodates a known latching circuit comprising metal-oxide-silicon (MOS) transistors T12, T13, T22, T23 and metal-nitride-oxide-silicon (MNOS) transistors T11, T21. The transistors T13, T23 have their gates and drains cross-connected, their courses being connected to a source voltage bus bar $V_{SS}$. The bus bar $V_{SS}$ is connected to the chip substrate. The transistors T12, T22 serve as series resistors between a drain voltage bus bar $V_{DD}$ and the transistors T13, T23 respectively. The gates of the transistors T12, T22 are connected to a source of reference potential, which, for the purposes of illustration, is taken as $V_{DD}$. MNOS transistors T11, T21 are connected in parallel with the transistors T12, T22 respectively. The gates of the MNOS transistors are commoned. The latching circuit works in a known way. One or other of the transistors T13, T23 conducts in dependence on whether a logic "0" or a logic "1" is represented. The logic condition may be staticised as a charge in one of the MNOS transistors, by applying a write pulse to their commoned gates. A stored charge is maintained even in the event of failure of power supplied to the chip. A stored logic condition may be transfered to the transistors T13, T14, by applying a read pulse to the commoned gates of the MNOS transistors T11, T21.

In the following description, all transistors are assumed to have p-type conductivity, and all references to polarity are compatible with this assumption. Since the substrate stands at earth potential, it follows that a power supply to operate the chip circuitry must have negative polarity. (With n-type transistors, positive polarity would be necessary.) Connection between the chip circuitry and points, such as sources of potential, external to the chip are established by means of conductive pads whose number is dependent on the details of the chip circuitry. Typical of these pads is the pad $p2$ to which negative potential is delivered from an external source over a lead 6, which is connected to the pad as shown at 7. Within the chip structure, the potential at the pad $p2$ is distributed as may be required by the chip circuitry, either direct to specific points or through switches or other circuit components. Such a distribution is represented generally by the broken line 8. Among the points served in this way are the drain voltage bus bar $V_{DD}$, and the drains $d13$, $d23$ of the transistors T13, T23. Potentials appearing at these last two points are effective to switch the transistors T13, T23 between the logic "0" and logic "1" conditions in the well-known way. It is well known that MOS transistors T12, T13, T22, T23 will suffer damage if a high positive potential appears at the pad $p2$. To prevent this possibility, a protective diode 9 is connected between the pad $p2$ and the substrate. This diode becomes conductive if a high positive potential should appear at the pad $p2$.

To operate the MNOS transistors T11, T21 involves applying read, write and erase pulses to their commoned gates. As writing and erasing are contrary operations, pulses of opposite polarity are used. Control means for developing these pulses comprise a resistor R connected in series with a capacitor C1 between first and second input terminals $t1$, $t2$. An output terminal $t3$ is located at the junction of the resistor R and capacitor C1. The resistor R and capacitor C1 have a time constant which is of the same order as the write time for the MNOS transistors T11, T21, for example 10 milliseconds. As shown, the resistor R is realised as part of the chip structure. The capacitor C1 is also realised as part of the chip structure, either by specific provision, or by exploitation of stray capacitance in the chip. The input nodes or terminals $t1$, $t2$ may each stand either at earth or at negative potentials. Earth potential is derived from the substrate. Negative potential is derived from the pad $p2$ as indicated by the broken line 10. At either terminal the change from one potential to the other is obtained by the appropriate switching of conventional MOS transistors (not shown). The output node or terminal $t3$ is connected to the gates of the MNOS transistors T11, T21, as indicated by the lead 11. The terminals $t1$, $t2$, $t3$ conveniently comprise suitable points on the chip circuitry, and in this event, have only a notional existence.

Three methods of operating the control means will now be described with reference to FIGS. 2, 3, 4. In these figures, earth potential is represented by a heavy line, positive or negative potentials being represented by light lines respectively above or below the heavy line. Potentials occuring at the terminals under quiescent conditions are shown in brackets, zero representing earth potential and N negative potential. In all three methods the quiescent potential at the first input terminal $t1$ is earth, and this potential is transmitted through the resistor R to the output terminal $t3$.

In the method shown in FIG. 2, the quiescent potential at the second input terminal $t2$ is negative, and the capacitor C1 is charged. When a pulse of earth potential is applied to the second input terminal $t2$, the potential at the output terminal $t3$ rises suddenly, at the beginning of the pulse to a positive value and then returns slowly to earth; and at the end of the pulse, fall suddenly to a negative value, and then returns slowly to earth. The positive excursion is used as an erase pulse E, and the negative excursion as a write pulse W. When a pulse of negative potential is applied to the first input terminal $t1$, the potential at the output terminal $t3$ falls slowly to a negative value during the pulse; and, after the end of the pulse, returns slowly to earth potential. These changes are used as a read pulse R.

In the method of FIG. 3, the quiescent conditions are the same as in the method of FIG. 2, and the read pulse R has the same features and is produced in the same way. However, the erase and write pulses E, W involve the simultaneous application of a pulse of negative potential to the first input terminal $t1$ and of a pulse of earth potential to the second input terminal $t2$. At the output terminal $t3$, the potential rises suddenly, at the beginning of the pulses, to a positive value, and then falls during the pulses to a negative value; after the end of the pulses, the negative potential increases suddenly to a greater value, and then returns slowly to earth potential. Compared with the method of FIG. 2, the voltage of the write pulse W is augmented, and this increases the time that the MNOS transistors will store information in the absence of a power supply.

In the method shown in FIG. 4 both input terminals are at earth potential under quiescent conditions, and there is no charge in the capacitor C1. Negative pulses are applied to the input terminals sequentially to produce erase and write pulses, and simultaneously to produce a read pulse. In greater detail, on the application of a pulse of negative potential to the second input terminal $t2$, the potential at the output terminal $t3$ falls suddenly to a negative value and then returns slowly to earth, producing a redundant write pulse $w$. The end of the pulse at the terminal $t2$ coincides with the beginning of a negative pulse at the first input terminal $t1$. As a result, the potential at the output terminal $t3$ rises abruptly to a positive value, producing an erase pulse E, which cancels the effects of the redundant write pulse $w$. During the second pulse, the potential at the output terminal $t3$ falls from the positive value to a negative value, producing a write pulse W whose effects are not subsequently cancelled. After the end of the second pulse, the potential at the output terminal $t3$ rises slowly to earth potential. A square-wave read pulse R is produced by applying negative potential simultaneously to the first and second input terminals $t1$, $t2$. This read pulse is shorter in duration than the read pulse of the methods of FIGS. 2, 3 and offers a correspondingly reduced read out time.

If difficulty is experienced in accommodating the resistor R in the chip, the device may take a hybrid form comprising a discrete resistor in combination with the chip, both being assembled together in a single package. Details of this arrangement are shown in FIG. 5. Near an edge 1 of the chip, two conductive pads $p3$, $p4$ are provided. External to the chip, the discrete resistor R is connected between these two pads by soldering or other suitable techniques. Within the chip, the pad $p3$ is connected to the first input terminal $t1$ and may also be connected to a protection diode 12 which acts in the manner explained in connection with the pad $p2$ and diode 9 (FIG. 1). As before, the capacitor C1 is connected between the second input terminal $t2$ and the output terminal $t3$. The output terminal $t3$ is connected to the pad $p4$. In order that a positive potential may be sustained at the output terminal $t3$, the pad $p4$ is insulated from the chip substrate and has no protection diode. To ensure that high positive potentials are not accidentally applied to the chip from external sources, the resistor R is assembled in the same package as the chip, and no connection is provided from outside the package to the pad $p4$. Thus, external voltage disturbances outside the package cannot cause a high positive potential at the pad $p4$.

The operation of the control means may be enhanced by modifying the control means and the latching circuit as shown in FIG. 6. Instead of being connected to the drain voltage bus bar $V_{DD}$, the MNOS transistors T11, T21 are connected by MOS transistors T14, T24 respectively to a power supply bus bar $V_{TT}$. The gates of the transistors T14, T24 are commoned, and are connected, as shown by the lead 14, to an additional output terminal $t4$ of the control means. The terminal $t4$ is connected to the same plate of the capacitor C1 as the second input terminal $t2$. The gates and the drain of the MNOS transistors T11, T21 are bridged by capacitors C11, C12 respectively. The potential at the power supply bus bar $V_{TT}$ should have a value in a range limited by the maximum potential applied to the input terminals $t1$, $t2$ and a lesser value dependent on stray capacitance in the chip. The value will in most cases exceed the potential at the drain voltage bus bar $V_{DD}$.

The purpose of the modifications is to protect the drain junction of the MNOS transistors T11, T21 during an erase pulse, and to ensure inhibition of writing when writing is not required. As already explained, an erase pulse E comprises positive potential delivered from the output terminal $t3$ to the gate of (say) the MNOS transistor T11. With the modifications, a corresponding reduction in negative potential is delivered simultaneously from the terminal $t4$ to the gate of the transistor T14, which is thereby switched out of conduction. Under these conditions, the effect of the capacitor C11 is to reduce the potential at the drain of the MNOS transistor T11, thereby preventing an excessive potential appearing at the drain junction of the transistor T11. Again as already explained, a write pulse W comprises negative potential delivered from the output terminal $t3$ to gates of the MNOS transistors T11, T21. During a write pulse, the second input terminal $t2$ stands at earth potential, which is delivered, by the terminal $t4$ and the lead 14, to the gate of (say) the MNOS transistor T14, the transistor thereby being made non-conductive. Under these conditions, the capacitor C1 is effective to make the drain potential of the transistor T14 more negative than the potential at the bus bar $V_{DD}$, with the result that the necessary write inhibit voltage is determined by the negative excursion of the drain of the transistor T14 and not by the potential $V_{DD}$, offering the advantage that the potential $V_{DD}$ may be lower than would otherwise be the case.

Further modifications shown in FIG. 7 allow an indication to be given if information being registered in the latching device is the same as information already stored therein. Instead of being applied directly to the drains $d13$, $d23$ (FIG. 1), signals, representing information to be registered, are applied via first and second input nodes to the gate of one or other of two admission MOS transistors T15, T25. These have their sources connected to the drains of the transistors T13, T23 respectively. Their drains are commoned and are connected firstly to the drain of a strobing MOS transistor T1, and secondly to the gate of a gating MOS transistor T2. Both of these transistors have their sources connected to the source voltage bus bar $V_{SS}$, that is to say, the chip substrate. Strobe pulses are applied to the gate of the transistor T1. The drain of the transistor T2 is connected to the source of an MOS transistor T3, which acts as a resistance because its gate and drain are both connected to the drain voltage bus bar $V_{DD}$. If desired, other MOS transistors may be provided in parallel with the transistor T2 to form a coincidence gate. One of these transistors is shown at T4. Each of these transistors is connected to a separate latching circuit in the manner just described in respect of the transistor T2. This is indicated in respect of the transistor T4 by the lead 15.

A strobe pulse applied to the base of the transistor T1 switches the transistor into conduction, and enables the transistors T15, T25. If the transistor T1 is non-conductive, and if the information presented for registration is the same as the information already stored, the transistor T15 (say) conducts in series with the transistor T13, and the potential at the gate of the transistor T2 falls to a low value. If the information presented differs from that stored, the potential at the gate of the transistor T2 has a high value. The transistor T4 operates similarly in respect of another latching circuit (not shown). With low potential at the gates of both the transistors T2, T4, the coincidence is indicated by a distinctive potential at the source of the transistor T3.

One way of realising the modifications shown in FIG. 6 is to use the chip construction shown in FIG. 8. The chip comprises a silicon substrate 16 with three p-type diffusions 17, 18, 19. The substrate is overlaid by a layer 20 of silicon dioxide, which is used both for MOS and MNOS transistors. Areas of the layer 20 which are to be used for storing electric charges are very thin in comparison with the rest of the layer 20. Except for areas left clear for contact making purposes, the chip area is overlaid by a layer of silicon nitride, part of which is shown at 21. Gate electrodes are then formed by metal deposition, as shown at 22, 23, the gate electrode 23 overlapping the diffusion 19 by an overlap 27. Conventional processes are employed in manufacturing the chip. Variable threshold transistors employed in the arrangement of FIG. 8 each have a channel region which has an area which is increased so as to give an enhanced capacitance between the gate and the channel of each transistor.

Referring now also to the circuit of FIG. 6, the diffusions 17, 18 act as the drain and source respectively, of the MOS transistor T14. Potential at the gate electrode 22 governs the operation of the transistor T14. The diffusion 18 also acts as the drain of the MOS transistor T11. The diffusion 19 acts as the source of the transistor T11. A potential at the gate electrode 23 induces a charge at the interface of the oxide and nitride layers 20, 21, in the well known way.

Between the diffusions 18, 19 the thickness of the oxide layer 20 changes from a relatively high value at margins 24, 25 to a relatively low value at the centre 26. The change in value is abrupt, giving a stepped profile. The part of the substrate 16 which lies between the diffusions 18, 19 acts as the capacitor C11 (FIG. 6). During an erase pulse, the gate electrode 23 of the transistor T11 stands at a positive potential, the effective part of the capacitor is the overlap 27, and the capacitor C11 exhibits a relatively low value. During a write pulse, the gate electrode 23 of the transistor T11 stands at a negative potential, a charge is induced at the interface of the layers 20, 21 causing a conductive inversion layer in the substrate 16 between the diffusions 18, 19. Under these conditions, the central portion 21 and both the margins 24, 25 contribute effectively to the capacitance, and the capacitor C11 exhibits a relatively high value.

What we claim is:

1. An electrical information storage device comprising:
   (a) an integrated circuit chip comprising a substrate and electrical circuitry on the substrate, said electrical circuitry comprising metal-nitride-oxide-silicon (MNOS) transistors, means for applying a reference potential to said substrate, conductive pad means for applying potentials of one polarity relative to the reference potential to said electrical circuitry, said conductive pad means comprising a conductive pad, protective device means connected between said conductive pad and said substrate for becoming conductive if the conductive pad to which it is connected obtains a potential having a polarity opposite to said one polarity; and
   (b) control means for controlling the potential at the gate electrodes of said MNOS transistors comprising, a first and a second input node, means for applying said reference potential and a potential of said one polarity respectively to said first and second input nodes, a resistor connected in series with a capacitor between said first and second input nodes, an output node at the junction of said resistor and capacitor, means for connecting said output node to said gate electrodes of said MNOS transistor, and means for insulating said output node and gate electrode from said substrate, wherein when the potential on said first and second input node is changed to the potential of said one polarity and said reference potential, respectively, the potential at the output node obtains a potential of said one or said opposite polarity in dependence on the potentials applied to the input nodes.

2. A storage device as claimed in claim 1 wherein said electrical circuitry comprises a latching circuit comprising a first pair of MOS transistors having their drain and gate electrodes cross-connected, a second pair of MOS transistors having their gates connected together, their drains connected together, their gates and drains connected with each other, and their sources connected with the drains of said first pair of MOS transistors, a pair of MNOS transistors each having its source and drain electrode connected in parallel with the source and drain electrodes of a respective one of said second pair of MOS transistors.

3. A storage device according to claim 1 in which said means for applying a reference potential to the substrate comprises a conductive pad connected to the substrate.

4. A storage device according to claim 1 in which the protection device means comprises a diode.

5. A storage device according to claim 1 in which said electrical circuitry of the integrated circuit chip has a pair of input nodes, an output node, means for impressing the state of the input nodes on to the transistors, and an output node which indicates whether the state of the input nodes and the state of the transistors are the same or different.

6. A storage device according to claim 1 in which the electrical circuitry of the integrated circuit chip has variable threshold transistors each having a channel region which has an area which is increased so as to give an enhanced capacitance between the gate and the channel of each transistor.

7. A storage device according to claim 1 in which the resistor is separate from the integrated circuit chip.

8. An electrical information storage device comprising:
   (a) an integrated circuit chip comprising a substrate and electrical circuitry on the substrate, said electrical circuitry comprising metal-nitride-oxide-silicon (MNOS) transistors interconnected with metal-oxide-silicon (MOS) transistors, means for applying a reference potential to said substrate, conductive pad means for applying potentials of one polarity relative to the reference potential to said electrical circuitry, said conductive pad means comprising a conductive pad, protective device means connected between said conductive pad and said substrate for becoming conductive if the conductive pad to which it is connected obtains a potential having a polarity opposite to said one polarity; and
   (b) control means for controlling the potential at the gate electrodes of said MNOS transistors comprising, a first and a second input node, means for applying said reference potential and a potential of said one polarity respectively to said first and second input nodes, a resistor connected in series with a capacitor between said first and second input nodes, an output node at the junction of said resistor and capacitor, means for connecting said output node to said gate electrodes of said MNOS transistor, and means for insulating said output node and gate electrode from said substrate, wherein when the potential on said first and second input node is changed to the potential of said one polarity and said reference potential, respectively, the potential at the output node obtains a potential of said one or said opposite polarity in dependence on the potentials applied to the input nodes.

9. A storage device as claimed in claim 8 wherein said electrical circuitry comprises a latching circuit comprising a first pair of MOS transistors having their drain and gate electrodes cross-connected, a second pair of MOS transistors having their gates connected together, their drains connected together, their gates and drains connected with each other, and their sources connected with the drains of said first pair of MOS transistors, a pair of MNOS transistors each having its source and drain electrode connected in parallel with the source and drain electrodes of a respective one of said second pair of MOS transistors.

* * * * *